US012592265B2

(12) United States Patent　　　　　(10) Patent No.:　US 12,592,265 B2
Song　　　　　　　　　　　　　　　　　　(45) Date of Patent:　　Mar. 31, 2026

(54) SEMICONDUCTOR DEVICE AND TRAINING METHOD OF THE SEMICONDUCTOR DEVICE

(71) Applicant: SK hynix Inc., Icheon-si (KR)

(72) Inventor: Choung Ki Song, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 148 days.

(21) Appl. No.: 18/497,772

(22) Filed: Oct. 30, 2023

(65) Prior Publication Data

US 2024/0274168 A1　　Aug. 15, 2024

(30) Foreign Application Priority Data

Feb. 13, 2023　(KR) ........................ 10-2023-0018657
Jul. 5, 2023　(KR) ........................ 10-2023-0086875

(51) Int. Cl.
*G11C 7/10*　　　　(2006.01)
*G11C 7/14*　　　　(2006.01)
*G11C 7/22*　　　　(2006.01)

(52) U.S. Cl.
CPC .............. *G11C 7/1084* (2013.01); *G11C 7/14* (2013.01); *G11C 7/222* (2013.01)

(58) Field of Classification Search
CPC .................................................. G11C 7/1084
See application file for complete search history.

(56) References Cited

U.S. PATENT DOCUMENTS

2020/0143854 A1*　5/2020　Kim ........................ G11C 7/222

* cited by examiner

*Primary Examiner* — Hoai V Ho
(74) *Attorney, Agent, or Firm* — WILLIAM PARK AND ASSOCIATES LTD.

(57) ABSTRACT

A semiconductor device including an input circuit including a buffer configured to buffer an external signal that is received from a pad, a variable delay circuit configured to delay a signal that is output by the buffer in response to a plurality of delay setting signals, and a latch configured to output the output of the variable delay circuit as an internal signal by latching the output in response to a clock signal, and a setting circuit configured to store the plurality of delay setting signals.

3 Claims, 7 Drawing Sheets

CS_e, CA_e, CLK_te, CLK_ce

Figure 6:
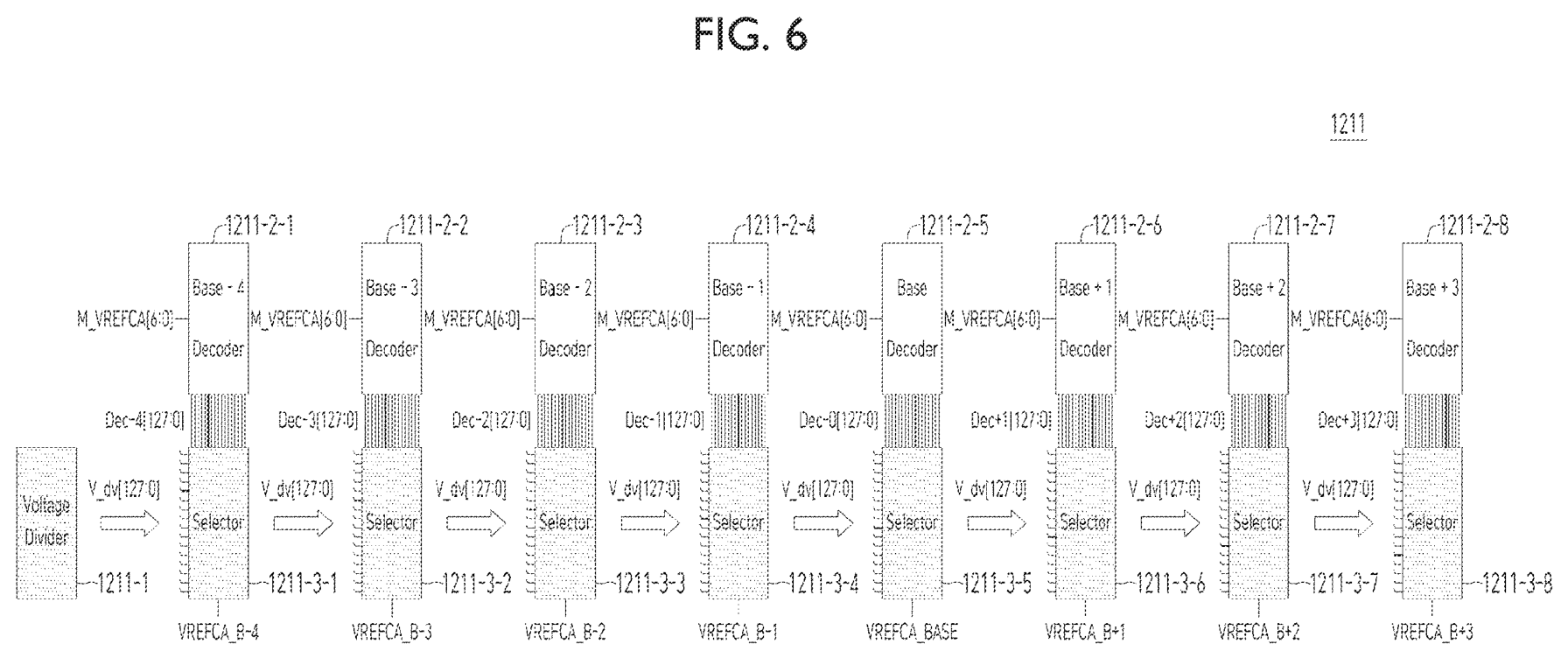

| 1211-2-1 | 1211-2-2 | 1211-2-3 | 1211-2-4 | 1211-2-5 | 1211-2-6 | 1211-2-7 | 1211-2-8 |
|---|---|---|---|---|---|---|---|
| Base - 4 | Base - 3 | Base - 2 | Base - 1 | Base | Base + 1 | Base + 2 | Base + 3 |
| Decoder | Decoder | Decoder | Decoder | Decoder | Decoder | Decoder | Decoder |

M_VREFCA[6:0]

Dec-4[127:0]   Dec-3[127:0]   Dec-2[127:0]   Dec-1[127:0]   Dec-0[127:0]   Dec+1[127:0]   Dec+2[127:0]   Dec+3[127:0]

V_dv[127:0]

| Selector | Selector | Selector | Selector | Selector | Selector | Selector | Selector |
|---|---|---|---|---|---|---|---|
| 1211-3-1 | 1211-3-2 | 1211-3-3 | 1211-3-4 | 1211-3-5 | 1211-3-6 | 1211-3-7 | 1211-3-8 |

VREFCA_B-4   VREFCA_B-3   VREFCA_B-2   VREFCA_B-1   VREFCA_BASE   VREFCA_B+1   VREFCA_B+2   VREFCA_B+3

V_dv[127:0]

Voltage Divider 1211-1

SEMICONDUCTOR DEVICE AND TRAINING METHOD OF THE SEMICONDUCTOR DEVICE

CROSS-REFERENCE TO RELATED APPLICATIONS

This application claims priority under 35 U.S.C. § 119(a) to Korean Patent Application Nos. 10-2023-0018657 filed on Feb. 13, 2023, and 10-2023-0086875 filed on Jul. 5, 2023, in the Korean Intellectual Property Office, which are incorporated herein by reference in their entireties.

BACKGROUND

1. Technical Field

Embodiments generally relate to a semiconductor integrated circuit and, more particularly, to a semiconductor device and a training method of the semiconductor device.

2. Related Art

Recently, as an electronic device is reduced in size, has low power consumption and high performance, and is diversified, a semiconductor device capable of storing information is required for various electronic devices, such as computers and portable communication devices. Furthermore, as the degree of integration of the semiconductor devices is increased, the semiconductor device has continued to be developed in order to improve the operating speed of the semiconductor device.

In order to improve the operating speed, a synchronous memory device that operates in synchronization with a clock signal has been developed. For a faster operating speed, the frequency of the clock signal is increased.

However, as the frequency of the clock signal is increased, signal integrity attributable to noise or skew may be deteriorated. Accordingly, it is necessary to find an optimal signal window or compensate for a signal skew through a training operation.

SUMMARY

In an embodiment, a semiconductor device may include an input circuit including a buffer configured to buffer an external signal that is received from a pad, a variable delay circuit configured to delay a signal that is output by the buffer in response to a plurality of delay setting signals, and a latch configured to output the output of the variable delay circuit as an internal signal by latching the output in response to a clock signal, and a setting circuit configured to store the plurality of delay setting signals.

In an embodiment, a training method of a semiconductor device may include performing a coarse training operation by a plurality of memory devices and performing a fine training operation per pad which is included in each of the plurality of memory devices.

BRIEF DESCRIPTION OF THE DRAWINGS

FIG. 6 is a diagram for describing a reference voltage generation circuit according to another embodiment of the present disclosure.

DETAILED DESCRIPTION

Hereinafter, embodiments according to the technical spirit of the present disclosure are described with reference to the accompanying drawings.

Various embodiments of the present disclosure provide a semiconductor device capable of performing a training operation for each semiconductor device in a semiconductor integrated circuit on which a plurality of semiconductor devices are mounted and a training method of a semiconductor device. Furthermore, embodiments of the present disclosure provide a semiconductor device capable of performing a training operation for each pad of each semiconductor device and a training method of a semiconductor device.

In an embodiment, the operational reliability of a semiconductor device can be improved.

Figure 1:
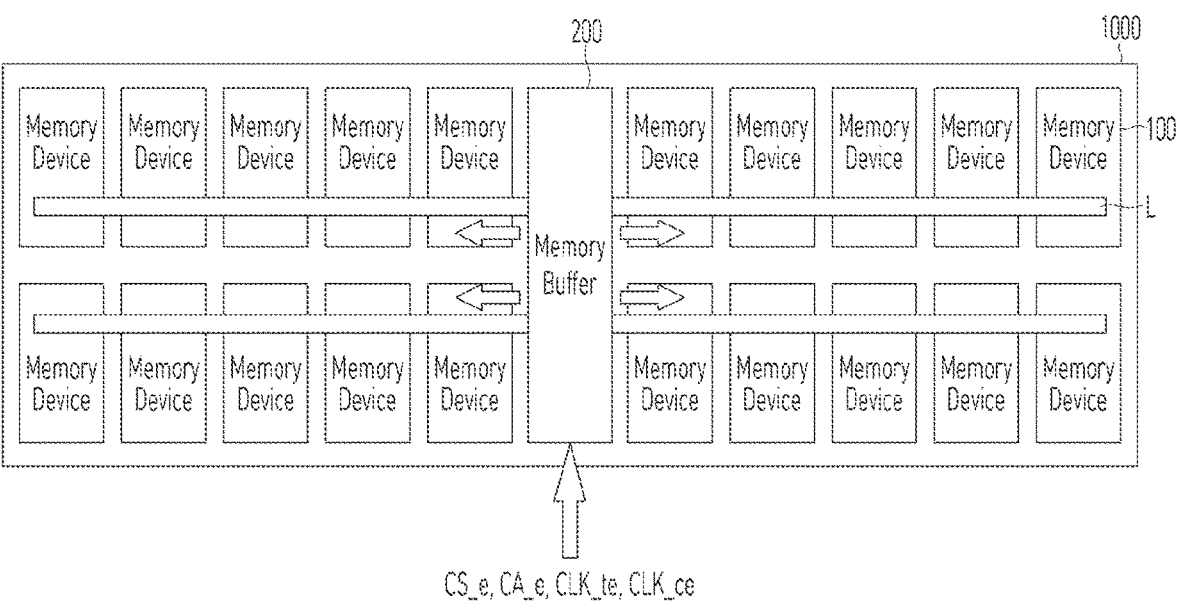
FIG. 1 is a diagram for describing a semiconductor integrated circuit according to an embodiment of the present disclosure.

FIG. 1 is a diagram for describing a semiconductor integrated circuit according to an embodiment of the present disclosure.

Referring to FIG. 1, a semiconductor integrated circuit 1000 may include a plurality of semiconductor devices, for example, memory devices 100 and a memory buffer 200.

The plurality of memory devices 100 may be electrically connected to the memory buffer 200 through lines L.

The memory buffer 200 may receive external signals CS_e, CA_e, CLK_te, and CLK_ce from an outside device, for example, a memory controller, and may transmit the received external signals to the plurality of memory devices 100 through the lines L.

The semiconductor integrated circuit 1000 constructed as above according to an embodiment of the present disclosure may operate as follows.

The plurality of memory devices 100 may operate in response to the external signals CS_e, CA_e, CLK_te, and CLK_ce that are provided by the memory buffer 200. In this case, the external signals CS_e, CA_e, CLK_te, and CLK_ce may include an external chip selection signal CS_e, an external operation control signal CA_e, and a pair of external clock signals CLK_te and CLK_ce having opposite phases. The external chip selection signal CS_e may be a signal that is used to select one of the plurality of memory devices 100. The external operation control signal CA_e may include a command and an address, and may be a signal that is used to perform operations, such as a write operation and read operation of a selected memory device. The pair of external clock signals CLK_te and CLK_ce may be clock signals that have been synchronized with the external chip selection signal CS_e and the external operation control signal CA_e.

The plurality of memory devices 100 may each be constructed to determine the external chip selection signal CS_e and the external operation control signal CA_e in response to the pair of external clock signals CLK_te and CLK_ce.

As illustrated in FIG. 1, the semiconductor integrated circuit 1000 may be constructed to transmit the external signals CS_e, CA_e, CLK_te, and CLK_ce to the plurality of memory devices 100 by using one memory buffer 200. Accordingly, the arrival times of the external signals CS_e, CA_e, CLK_te, and CLK_ce from the memory buffer 200 to each memory device 100 may be different depending on a distance and location between the memory buffer 200 and each memory device 100. An arrival time between the external signals CS_e, CA_e, CLK_te, and CLK_ce may also be different.

Accordingly, the semiconductor integrated circuit 1000 may perform a training operation so that the arrival times of the external signals CS_e, CA_e, CLK_te, and CLK_ce from the memory buffer 200 to the plurality of memory devices 100 becomes identical. For example, each of the plurality of memory devices 100 may set an internal delay time through a training operation. Furthermore, each of the plurality of memory devices 100 may set the level of a reference voltage for determining the external signals CS_e, CA_e, CLK_te, and CLK_ce, in particular, the external chip selection signal CS_e and the external operation control signal CA_e through a training operation.

Figure 2:
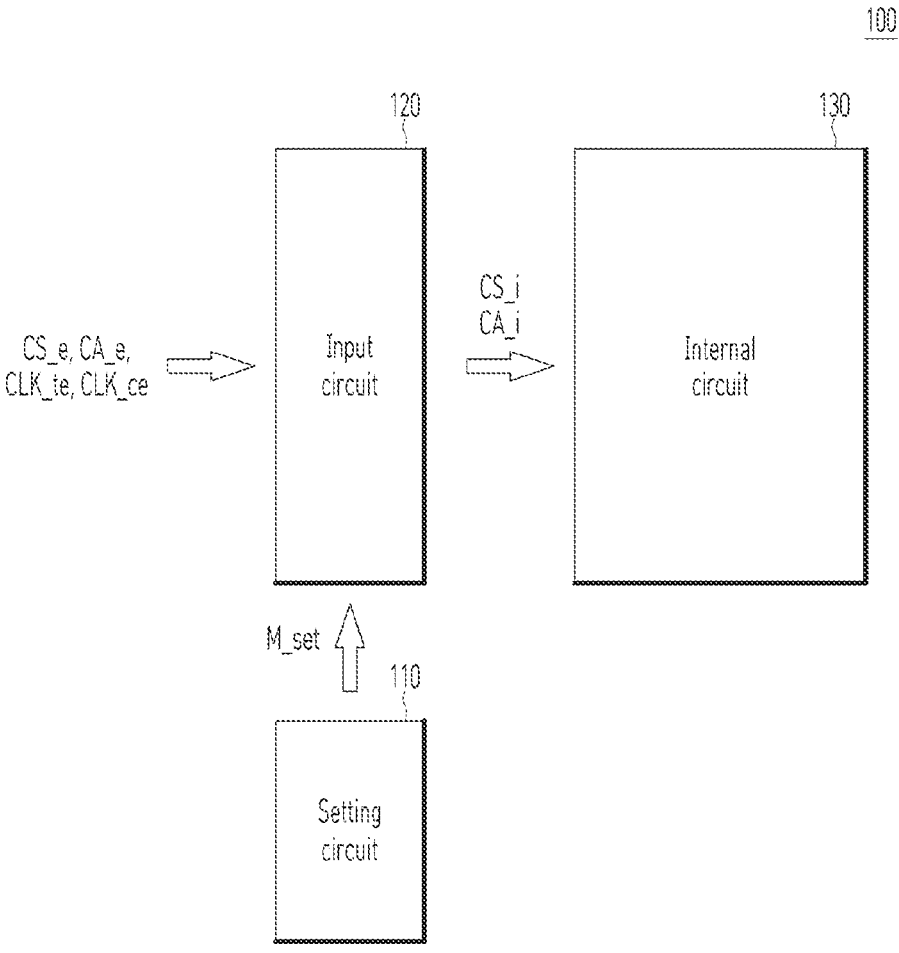
FIG. 2 is a diagram for describing a semiconductor device according to an embodiment of the present disclosure.

FIG. 2 is a diagram for describing a semiconductor device according to an embodiment of the present disclosure.

Referring to FIG. 2, the plurality of memory devices 100, for example, each of the memory devices 100 may include a setting circuit 110, an input circuit 120, and an internal circuit 130.

The setting circuit 110 may store a setting value having an internal delay time and a reference voltage level through a training operation. Furthermore, the setting circuit 110 may provide the input circuit 120 with the setting value stored through the training operation as a setting signal M_set. For example, the setting circuit 110 may include a mode register set.

The input circuit 120 may set the internal delay time and the reference voltage level in response to the setting signal M_set. Furthermore, the input circuit 120 may determine the external chip selection signal CS_e and the external operation control signal CA_e based on the pair of external outputs CLK_te and CLK_ce, the set internal delay time, and the set reference voltage level, and may transmit the determined external chip selection signal CS_e and external operation control signal CA_e to the internal circuit 130 as an internal chip selection signal CS_i and an internal operation control signal CA_i, respectively. In some embodiments, the internal chip selection signal CS_i and an internal operation control signal CA_i may be generally referred to as an internal signal.

The internal circuit 130 may operate in response to the internal chip selection signal CS_i and the internal operation control signal CA_i that are transmitted by the input circuit 120. For example, the internal circuit 130 may be activated or deactivated in response to the internal chip selection signal CS_i. Furthermore, the internal circuit 130 that has been activated in response to the internal operation control signal CA_i may perform a write operation or a read operation.

Figure 3:
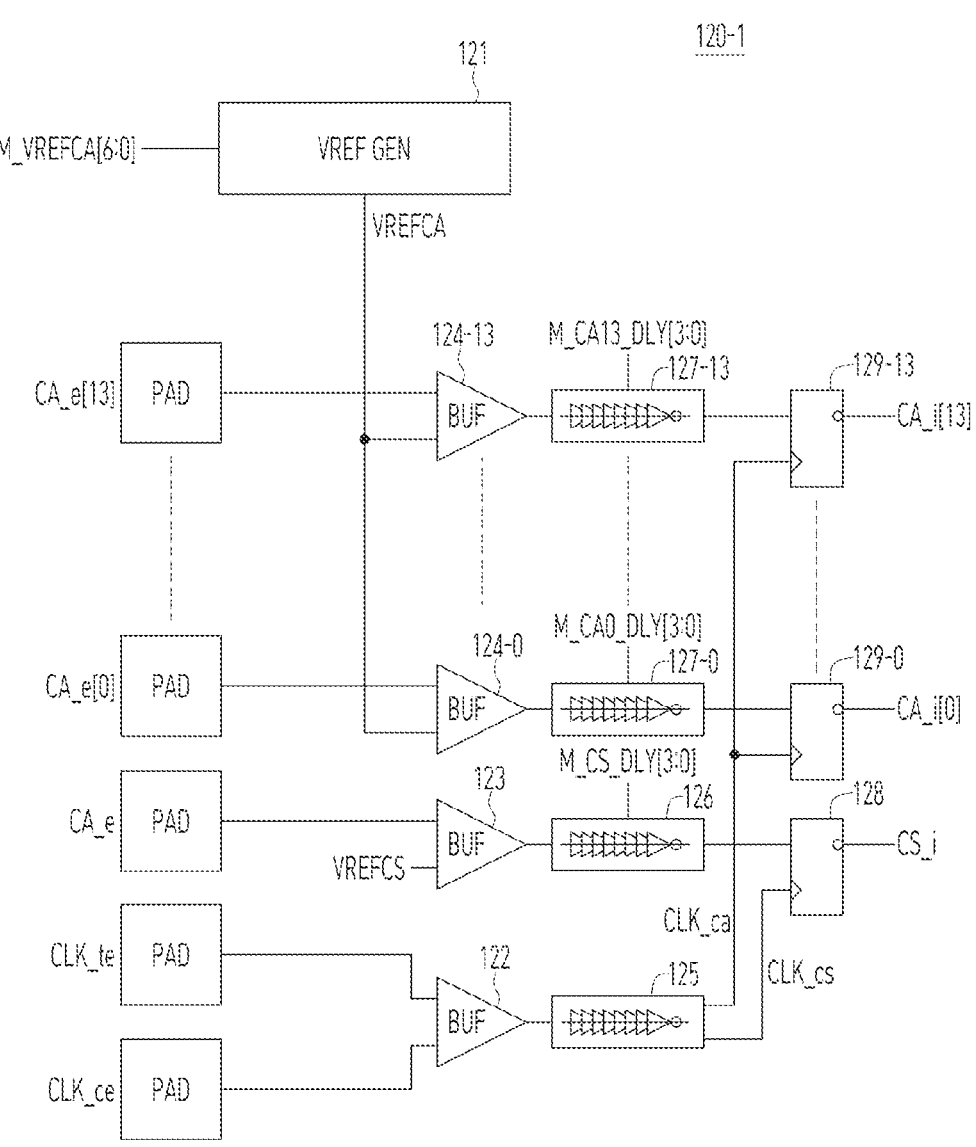
FIG. 3 is a diagram for describing an input circuit according to an embodiment of the present disclosure.

FIG. 3 is a diagram for describing an input circuit according to an embodiment of the present disclosure.

Referring to FIG. 3, an input circuit 120-1 may include a reference voltage generation circuit (VREF GEN) 121, a plurality of buffers (BUF) 122, 123, and 124-0 to 124-13, a delay circuit 125, a plurality of variable delay circuits 126 and 127-0 to 127-13, and a plurality of latches 128 and 129-0 to 129-13.

The reference voltage generation circuit 121 may generate a reference voltage VREFCA for an operation control signal determination in response to a reference voltage setting signal M_VREFCA[6:0]. For example, the reference voltage generation circuit 121 may adjust the voltage level of the reference voltage VREFCA for an operation control signal determination in response to the reference voltage setting signal M_VREFCA[6:0].

The plurality of buffers 122, 123, and 124-0 to 124-13 may include a buffer 122 for a clock, a buffer 123 for a chip selection signal, and a plurality of buffers 124-0 to 124-13 for operation control.

The buffer 122 for a clock may buffer the pair of external clock signals CLK_te and CLK_ce that are transmitted by pads PAD and transmit the pair of external clock signals CLK_te and CLK_ce to the delay circuit 125.

The buffer 123 for a chip selection signal may buffer the external chip selection signal CS_e that is transmitted by a pad PAD and transmit the external chip selection signal CS_e to the variable delay circuit 126. In this case, the buffer 123 for a chip selection signal may buffer the external chip selection signal CS_e in response to the voltage level of the reference voltage VREFCS for a chip selection signal determination. For example, the buffer 123 for a chip selection signal may compare the voltage level of the reference voltage VREFCS for a chip selection signal determination and the level of the external chip selection signal CS_e, and may output a result of the comparison to the variable delay circuit 126.

The plurality of buffers 124-0 to 124-13 for operation control may buffer the external operation control signals CA_e[0] to CA_e[13] that are transmitted by pads PAD, respectively, and transmit the external operation control signals CA_e[0] to CA_e[13] to the variable delay circuits 127-0 to 127-13, respectively. In this case, the plurality of buffers 124-0 to 124-13 for operation control may buffer the external operation control signals CA_e[0] to CA_e[13] based on the voltage level of the reference voltage VREFCA for an operation control signal determination. For example, each of the plurality of buffers 124-0 to 124-13 for operation control may compare the voltage level of the reference voltage VREFCA for an operation control signal determination and each of the levels of external operation control signals CA_e[0] to CA_e[13], and may output a result of the comparison to each of the variable delay circuits 127-0 to 127-13. In this case, the external operation control signals CA_e[0] to CA_e[13] may include first to fourteenth external operation control signals CA_e[0] to CA_e[13]. Accordingly, the plurality of buffers 124_0 to 124-13 for operation control may include first to fourteenth buffers 124_0 to 124_13 for operation control. The first to fourteenth, that is, the fourteen external operation control signals CA_e[0] to CA_e[13] have been merely described as an example, and might not limit the number of external operation control signals.

The delay circuit 125 may generate a clock signal CLK_ca for operation control and a clock signal CLK_cs for chip selection by delaying the output of the buffer 122 for a clock by a set delay time.

The plurality of variable delay circuits 126 and 127_0 to 127_13 may include a variable delay circuit 126 for a chip selection signal and a plurality of variable delay circuits 127-0 to 127-13 for an operation control signal.

The delay time of the variable delay circuit 126 for a chip selection signal may be set in response to a chip selection delay setting signal M_CS_DLY[3:0]. The variable delay circuit 126 for a chip selection signal may delay the output of the buffer 123 for a chip selection signal by a set delay time.

The plurality of variable delay circuits 127-0 to 127-13 for an operation control signal may include first to fourteenth variable delay circuits 127-0 to 127-13 for an operation control signal.

The delay times of the first to fourteenth variable delay circuits 127-0 to 127-13 for an operation control signal may be set in response to first to fourteenth delay setting signals M_CA0_DLY[3:0] to M_CA13_DLY[3:0] for operation control, respectively. The first to fourteenth variable delay circuits 127-0 to 127-13 for an operation control signal may delay the outputs of the first to fourteenth buffers 124-0 to 124-13 for operation control, respectively, by a set delay time.

The plurality of latches 128 and 129-0 to 129-13 may each include a flipflop. For example, the plurality of flipflop 128 and 129-0 to 129-13 may include a flipflop 128 for a chip selection signal and a plurality of flipflops 129-0 to 129-13 for an operation control signal.

The flipflop 128 for a chip selection signal may output the output of the variable delay circuit 126 for a chip selection signal as the internal chip selection signal CS_i by latching the output of the variable delay circuit 126 for a chip selection signal in response to the clock signal CLK_cs for chip selection. For example, the flipflop 128 for a chip selection signal may latch the output of the variable delay circuit 126 for a chip selection signal at an edge of the clock signal CLK_cs for chip selection. Furthermore, the flipflop 128 for a chip selection signal may output the latched output as the internal chip selection signal CS_i. More specifically, for example, the flipflop 128 for a chip selection signal may latch the level of the output of the variable delay circuit 126 for a chip selection signal at rising timing or falling timing of the clock signal CLK_cs for chip selection, and may output the latched level of the output as the level of the internal chip selection signal CLK_cs.

The plurality of flipflops 129-0 to 129-13 for an operation control signal may include first to fourteenth flipflops 129-0 to 129-13 for an operation control signal. The first to fourteenth flipflops 129-0 to 129-13 for an operation control signal may output the outputs of the first to fourteenth variable delay circuits 127-0 to 127-13 for an operation control signal as the internal operation control signals CA_i[0] to CA_i[13], respectively, by latching the outputs of the first to fourteenth variable delay circuits 127-0 to 127-13 for an operation control signal in response to the clock signal CLK_ca for operation control. In this case, the internal operation control signals CA_i[0] to CA_i[13] may include first to fourteenth internal operation control signals CA_i[0] to CA_i[13]. Accordingly, the first to fourteenth flipflops 129-0 to 129-13 for an operation control signal may latch the outputs of the first to fourteenth variable delay circuits 127-0 to 127-13 for an operation control signal, respectively, in response to the clock signal CLK_ca for operation control, and may output the latched outputs as the first to fourteenth internal operation control signals CA_i[0] to CA_i[13], respectively. In this case, the first to fourteenth flipflops 129-0 to 129-13 for operation control may latch the outputs of the first to fourteenth variable delay circuits 127-0 to 127-13 for an operation control signal at an edge, for example, at rising timing or falling timing of the clock signal CLK_ca for operation control, and may output the latched outputs as the first to fourteenth internal operation control signals CA_i[0] to CA_i[13].

The reference voltage setting signal M_VREFCA[6:0] and the first to fourteenth delay setting signals M_CA0_DLY[3:0] to M_CA13_DLY[3:0] for operation control, which have been described with reference to FIG. 3, may be the setting signal M_set that has been stored in the setting circuit 110 described with reference to FIG. 2. That is, the setting signal M_set may include the reference voltage setting signal M_VREFCA[6:0] and the first to fourteenth delay setting signals M_CA0_DLY[3:0] to M_CA13_DLY[3:0] for operation control. In this case, the reference voltage setting signal M_VREFCA[6:0] that adjusts the voltage level of the reference voltage VREFCA for an operation control signal determination, which is provided to the first to fourteenth buffers 124-0 to 124-13 for operation control in common, may be stored in the setting circuit 110 to be described later as the results of a coarse training operation. Furthermore, the first to fourteenth delay setting signals M_CA0_DLY[3:0] to M_CA13_DLY[3:0] for operation control, which set the delay times of the first to fourteenth variable delay circuits 127-0 to 127-13 for an operation control signal, respectively, and the chip selection delay setting signal M_CS_DLY[3:0] that sets the delay time of the variable delay circuit 126 for a chip selection signal may be stored in the setting circuit 110 to be described later as the results of a fine training operation.

Figure 4:
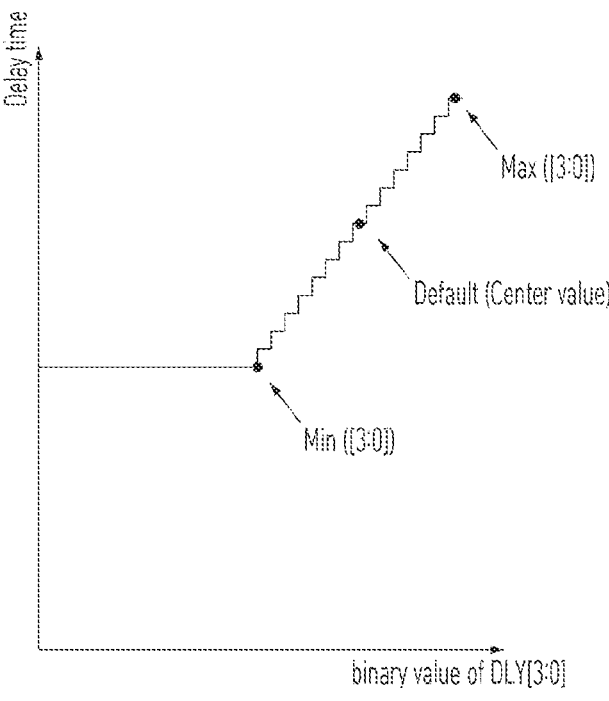
FIG. 4 is a graph for describing an operation of the input circuit according to an embodiment of the present disclosure.

FIG. 4 is a graph for describing an operation of the input circuit according to an embodiment of the present disclosure.

FIG. 4 may be a graph for describing the adjustment of the delay times of the variable delay circuit 126 for a chip selection signal and the first to fourteenth variable delay circuits 127-0 to 127-13 for an operation control signal, which have been illustrated in FIG. 3.

The chip selection delay setting signal M_CS_DLY[3:0] and the first to fourteenth delay setting signals M_CA0_DLY[3:0] to M_CA13_DLY[3:0] for operation control may each include first to fourth bit signals [3:0]. In this case, the first to fourth bit signals [3:0] may have values of (0,0,0,0) to (1,1,1,1), respectively, when the first to fourth bit signals are sequentially listed. A minimum value Min of the first to fourth bit signals [3:0] may be (0,0,0,0), and a maximum value Max of the first to fourth bit signals [3:0] may be (1,1,1,1).

Referring to FIG. 4, the chip selection delay setting signal M_CS_DLY[3:0] and the first to fourteenth delay setting signals M_CA0_DLY[3:0] to M_CA13_DLY[3:0] for operation control may adjust, to a minimum, the delay time of the variable delay circuit 126 for a chip selection signal and the delay times of the first to fourteenth variable delay circuits 127-0 to 127-13 for an operation control signal, respectively, when the first to fourth bit signals [3:0] have the minimum value Min. Furthermore, the chip selection delay setting signal M_CS_DLY[3:0] and the first to fourteenth delay setting signals M_CA0_DLY[3:0] to M_CA13_DLY[3:0] for operation control may adjust, to a maximum, the delay time of the variable delay circuit 126 for a chip selection signal and the delay times of the first to fourteenth variable delay circuits 127-0 to 127-13 for an operation control signal, respectively, when the first to fourth bit signals [3:0] have the maximum value Max. Furthermore, as the value of the first to fourth bit signals [3:0] is increased, the chip selection delay setting signal M_CS_DLY[3:0] and the first to fourteenth delay setting signals M_CA0_DLY[3:0] to M_CA13_DLY[3:0] for operation control may increase the delay time of the variable delay circuit 126 for a chip selection signal and the delay times of the first to fourteenth variable delay circuits 127-0 to 127-13 for an operation control signal, respectively. As the value of the first to fourth bit signals [3:0] is decreased, the chip selection delay setting signal M_CS_DLY[3:0] and the first to fourteenth delay setting signals M_CA0_DLY[3:0] to M_CA13_DLY[3:0] for operation control may decrease the delay time of the variable delay circuit 126 for a chip selection signal and the delay times of the first to fourteenth variable delay circuits 127-0 to 127-13 for an operation control signal, respectively. When the results of a coarse training operation are applied, the chip selection delay setting signal M_CS_DLY[3:0] and the first to fourteenth delay setting signals M_CA0_DLY[3:0] to M_CA13_DLY[3:0] for operation control may each be set as a center value (i.e., default) of the first to fourth bit signals [3:0]. When the results of a fine training operation are applied, the center value may be increased or decreased.

Each of the plurality of memory devices according to an embodiment of the present disclosure may set the voltage level of the reference voltage VREFCA for an operation control signal determination for determining the plurality of external operation control signals CA_e[0] to CA_e[13] through a coarse training operation.

Furthermore, each of the memory devices according to an embodiment of the present disclosure may set the delay time of an input signal by the plurality of external operation control signals CA_e[0] to CA_e[13] and by the external chip selection signal CS_e through a fine training operation. That is, each of the memory devices according to an embodiment of the present disclosure may set the delay time of the input signal for each pad PAD.

Figure 5:
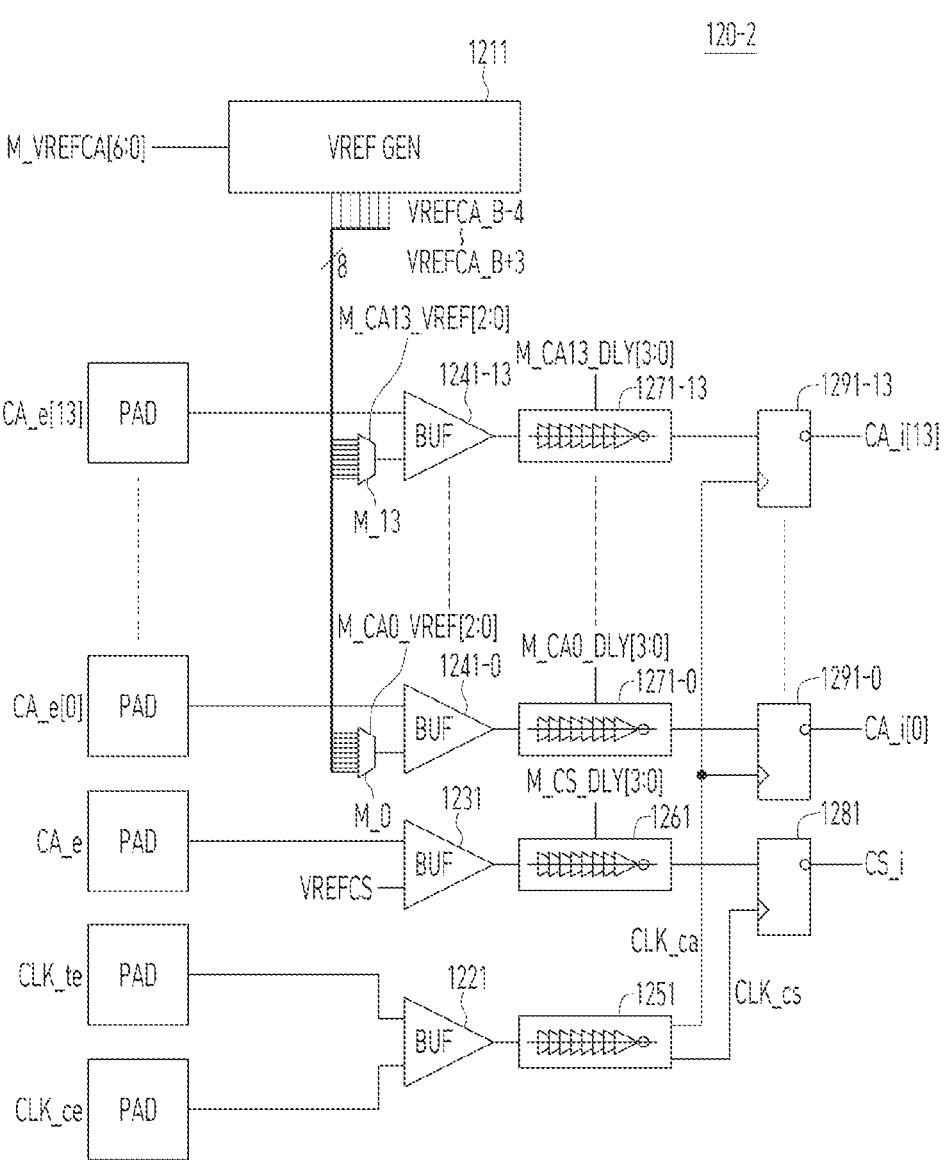
FIG. 5 is a diagram for describing an input circuit according to another embodiment of the present disclosure.

FIG. 5 is a diagram for describing an input circuit according to another embodiment of the present disclosure.

Referring to FIG. 5, an input circuit 120-2 may include a reference voltage generation circuit (VREF GEN) 1211, a plurality of buffers (BUF) 1221, 1231, and 1241-0 to 1241-13, a delay circuit 1251, a plurality of variable delay circuits 1261 and 1271-0 to 1271-13, a plurality of latches 1281 and 1291-0 to 1291-13, and a plurality of multiplexers M_0 to M_13.

The reference voltage generation circuit 1211 may generate a plurality of reference voltages VREFCA_B−4 to VREFCA_B+3 for an operation control signal determination in response to a reference voltage setting signal M_VREFCA[6:0]. For example, the reference voltage generation circuit 1211 may adjust the voltage levels of the plurality of reference voltages VREFCA_B−4 to VREFCA_B+3 for an operation control signal determination in response to the reference voltage setting signal M_VREFCA[6:0].

The plurality of buffers 1221, 1231, and 1241-0 to 1241-13 may include a buffer 1221 for a clock, a buffer 1231 for a chip selection signal, and a plurality of buffers 1241-0 to 1241-13 for operation control.

The buffer 1221 for a clock may buffer the pair of external clock signals CLK_te and CLK_ce that are transmitted by pads PAD and transmit the pair of external clock signals CLK_te and CLK_ce to the delay circuit 1251.

The buffer 1231 for a chip selection signal may buffer the external chip selection signal CS_e that is transmitted by a pad PAD and transmit the external chip selection signal CS_e to the variable delay circuit 1261. In this case, the buffer 1231 for a chip selection signal may buffer the external chip selection signal CS_e based on the voltage level of a reference voltage VREFCS for a chip selection signal determination. For example, the buffer 1231 for a chip selection signal may compare the voltage level of the reference voltage VREFCS for a chip selection signal determination and the level of the external chip selection signal CS_e, and may output a result of the comparison to the variable delay circuit 1261.

The plurality of buffers 1241-0 to 1241-13 for operation control may buffer the external operation control signals CA_e[0] to CA_e[13] that are transmitted by pads PAD, and may transmit the external operation control signals CA_e[0] to CA_e[13] to the variable delay circuits 1271-0 to 1271-13, respectively. In this case, each of the plurality of buffers 1241-0 to 1241-13 for operation control may buffer a corresponding signal of the external operation control signals CA_e[0] to CA_e[13] based on the voltage level of a selected one of the plurality of reference voltages VREFCA_B−4 to VREFCA_B+3 for an operation control signal determination. For example, each of the plurality of buffers 1241-0 to 1241-13 for operation control may compare the voltage level of a selected reference voltage for an operation control signal determination and the level of a corresponding one of the external operation control signals CA_e[0] to CA_e[13], and may output a result of the comparison to each of the variable delay circuits 1271-0 to 1271-13. In this case, the external operation control signals CA_e[0] to CA_e[13] may include first to fourteenth external operation control signals CA_e[0] to CA_e[13]. Accordingly, the plurality of buffers 1241_0 to 1241-13 for operation control may include first to fourteenth buffers 1241-0 to 1241-13 for operation control.

The plurality of multiplexers M_0 to M_13 may include first to fourteenth multiplexers M_0 to M_13. The first to fourteenth multiplexers M_0 to M_13 may each select one of the plurality of reference voltages VREFCA_B−4 to VREFCA_B+3 for an operation control signal determination in response to each of first to fourteenth reference voltage level selection signals M_CA0_VREF[2:0] to M_CA13_VREF[2:0], and may each provide the selected reference voltage for an operation control signal determination to each of the first to fourteenth buffers 1241-0 to 1241-13 for operation control. For example, the first multiplexer M_0 may select one of the plurality of reference voltages VREFCA_B−4 to VREFCA_B+3 for an operation control signal determination in response to the first reference voltage level selection signal M_CA0_VREF[2:0], and may provide the selected reference voltage for an operation control signal determination to the first buffer 1241-0 for operation control.

The delay circuit 1251 may generate a clock signal CLK_ca for operation control and a clock signal CLK_cs for chip selection by delaying the output of the buffer 1221 for a clock by a set delay time.

The plurality of variable delay circuits 1261 and 1271_0 to 1271_13 may include a variable delay circuit 1261 for a chip selection signal and a plurality of variable delay circuits 1271-0 to 1271-13 for an operation control signal.

The delay time of the variable delay circuit 1261 for a chip selection signal may be set in response to the chip selection delay setting signal M_CS_DLY[3:0]. The variable delay circuit 1261 for a chip selection signal may delay the output of the buffer 1231 for a chip selection signal by a set delay time.

The plurality of variable delay circuits 1271-0 to 1271-13 for an operation control signal may include first to fourteenth variable delay circuits 1271-0 to 1271-13 for an operation control signal.

The delay times of the first to fourteenth variable delay circuits 1271-0 to 1271-13 for an operation control signal may be set in response to the first to fourteenth delay setting signals M_CA0_DLY[3:0] to M_CA13_DLY[3:0] for operation control, respectively. The first to fourteenth variable delay circuits 1271-0 to 1271-13 for an operation control signal may delay the outputs of the first to fourteenth buffers 1241-0 to 1241-13 for operation control, respectively, by a set delay time.

The plurality of latches 1281 and 1291-0 to 1291-13 may each include a flipflop. For example, the plurality of flipflops 1281 and 1291-0 to 1291-13 may include a flipflop 1281 for a chip selection signal and a plurality of flipflops 1291-0 to 1291-13 for an operation control signal.

The flipflop 1281 for a chip selection signal may output the output of the variable delay circuit 1261 for a chip selection signal as an internal chip selection signal CS_i by latching the output of the variable delay circuit 1261 for a chip selection signal in response to the clock signal CLK_cs for chip selection.

The plurality of flipflops 1291-0 to 1291-13 for an operation control signal may include first to fourteenth flipflops 1291-0 to 1291-13 for an operation control signal. The first to fourteenth flipflops 1291-0 to 1291-13 for an operation control signal may output the outputs of the first to fourteenth variable delay circuits 1271-0 to 1271-13 for an operation control signal as internal operation control signals CA_i[0] to CA_i[13], respectively, by latching the outputs of the first to fourteenth variable delay circuits 1271-0 to 1271-13 for an operation control signal, respectively, in response to the clock signal CLK_ca for operation control. In this case, the internal operation control signals CA_i[0] to CA_i[13] may include first to fourteenth internal operation control signals CA_i[0] to CA_i[13]. Accordingly, the first to fourteenth flipflops 1291-0 to 1291-13 for an operation control signal may latch the outputs of the first to fourteenth variable delay circuits 1271-0 to 1271-13 for an operation control signal, respectively, in response to the clock signal CLK_ca for operation control, and may output the latched outputs as the first to fourteenth internal operation control signals CA_i[0] to CA_i[13], respectively.

The reference voltage setting signal M_VREFCA[6:0], the first to fourteenth delay setting signals M_CA0_DLY[3:0] to M_CA13_DLY[3:0] for operation control, and the first to fourteenth reference voltage level selection signals M_CA0_VREF[2:0] to M_CA13_VREF[2:0], which have been described with reference to FIG. 5, may be the setting signal M_set that has been stored in the setting circuit 110 described with reference to FIG. 2. That is, the setting signal M_set may include the reference voltage setting signal M_VREFCA[6:0], the first to fourteenth delay setting signals M_CA0_DLY[3:0] to M_CA13_DLY[3:0] for operation control, and the first to fourteenth reference voltage level selection signals M_CA0_VREF[2:0] to M_CA13_VREF[2:0]. In this case, the reference voltage setting signal M_VREFCA[6:0] that adjusts the voltage levels of the plurality of reference voltages VREFCA_B−4 to VREFCA_B+3 for an operation control signal determination, which are provided to the first to fourteenth buffers 1241-0 to 1241-13 for operation control in common, may be stored in the setting circuit 110 as the results of a coarse training operation. Furthermore, the first to fourteenth delay setting signals M_CA0_DLY[3:0] to M_CA13_DLY[3:0] for operation control, which set the delay times of the first to fourteenth variable delay circuits 1271-0 to 1271-13 for an operation control signal, respectively, and the chip selection delay setting signal M_CS_DLY[3:0] that sets the delay time of the variable delay circuit 1261 for a chip selection signal may be stored in the setting circuit 110 as the results of a fine training operation. Furthermore, the first to fourteenth reference voltage level selection signals M_CA0_VREF[2:0] to M_CA13_VREF[2:0] each for selecting one of the plurality of reference voltages VREFCA_B−4 to VREFCA_B+3 for an operation control signal determination and providing the selected reference voltage to each of the first to fourteenth buffers 1241-0 to 1241-13 for operation control may also be stored in the setting circuit 110 as the results of a fine training operation.

FIG. 6 is a diagram for describing a reference voltage generation circuit according to another embodiment of the present disclosure.

Referring to FIG. 6, the reference voltage generation circuit 1211 may include a voltage divider 1211-1, a plurality of decoders 1211-2-1 to 1211-2-8, and a plurality of selection circuits 1211-3-1 to 1211-3-8 (i.e., selectors). For example, the plurality of decoders 1211-2-1 to 1211-2-8 may include first to eighth decoders 1211-2-1 to 1211-2-8. The plurality of selection circuits 1211-3-1 to 1211-3-8 may include the first to eighth selection circuits 1211-3-1 to 1211-3-8.

The voltage divider 1211-1 may generate a plurality of divided voltages V_dv[127:0] having different voltage levels. In this case, the plurality of divided voltages V_dv[127:0] may include first to 128-th divided voltages V_dv[0] to V_dv[127].

The first to eighth decoders 1211-2-1 to 1211-2-8 may generate first to eighth decoding signals Dec−4[127:0], Dec−3[127:0], Dec−2[127:0], Dec−1[127:0], Dec−0[127:0], Dec+1[127:0], Dec+2[127:0], and Dec+3[127:0], respectively, by each decoding the reference voltage setting signal M_VREFCA[6:0]. In this case, the decoding values of the first to eighth decoding signals Dec−4[127:0], Dec−3[127:0], Dec−2[127:0], Dec−1[127:0], Dec−0[127:0], Dec+1[127:0], Dec+2[127:0], and Dec+3[127:0] may be different from each other. For example, the first to eighth decoders 1211-2-1 to 1211-2-8 may be constructed so that the decoding values of the outputs Dec−1[127:0], Dec−2[127:0], Dec−3[127:0], and Dec−4[127:0] of the fourth decoder 1211-2-4, the third decoder 1211-2-3, the second decoder 1211-2-2, and the first decoder 1211-2-1 are sequentially reduced and the decoding values of the outputs Dec+1[127:0], Dec+2[127:0], Dec+3[127:0] of the sixth decoder 1211-2-6, the seventh decoder 1211-2-7, and the eighth decoder 1211-2-8 are sequentially increased on the basis of the decoding value of the fifth decoding signal Dec−0[127:0], that is, the output of the fifth decoder 1211-2-5.

The first to eighth selection circuits 1211-3-1 to 1211-3-8 may each be constructed to select one of the first to 128-th divided voltages V_dv[0] to V_dv[127] in response to each of the first to eighth decoding signals Dec−4[127:0], Dec−3[127:0], Dec−2[127:0], Dec−1[127:0], Dec−0[127:0], Dec+1[127:0], Dec+2[127:0], and Dec+3[127:0] and to output the selected divided voltage as each of the first to eighth reference voltages VREFCA_B−4 to VREFCA_B+3 for an operation control signal determination. For example, the first selection circuit 1211-3-1 may select one of the first to 128-th divided voltages V_dv[127:0] in response to the first decoding signal Dec−4[127:0], and may output the selected divided voltage as the first reference voltage VREFCA_B−4 for an operation control signal determination. In this case, the plurality of reference voltages VREFCA_B−4 to VREFCA_B+3 for an operation control signal determination may include first to eighth reference voltages VREFCA_B−4 to VREFCA_B+3 for an operation control signal determination.

The first to eighth selection circuits 1211-3-1 to 1211-3-8 may be constructed to select divided voltages corresponding to the decoding values of the first to eighth decoding signals Dec−4[127:0], Dec−3[127:0], Dec−2[127:0], Dec−1[127:0], Dec−0[127:0], Dec+1[127:0], Dec+2[127:0], and Dec+3[127:0], respectively. Accordingly, the levels of the outputs VREFCA_B−1, VREFCA_B−2, VREFCA_B−3, and VREFCA_B−4 of the fourth selection circuit 1211-3-4, the third selection circuit 1211-3-3, the second selection circuit 1211-3-2, and the first selection circuit 1211-3-1 may be sequentially lowered on the basis of the output of the fifth selection circuit 1211-3-5, that is, the fifth reference voltage VREFCA_BASE for an operation control signal determination. Furthermore, the levels of the outputs VREFCA_B+1, VREFCA_B+2, and VREFCA_B+3 of the sixth selection circuit 1211-3-6, the seventh selection circuit 1211-3-7, and the eighth selection circuit 1211-3-8 may sequentially rise on the basis of the output of the fifth selection circuit 1211-3-5, that is, the fifth reference voltage VREFCA_BASE for an operation control signal determination.

Figure 7:
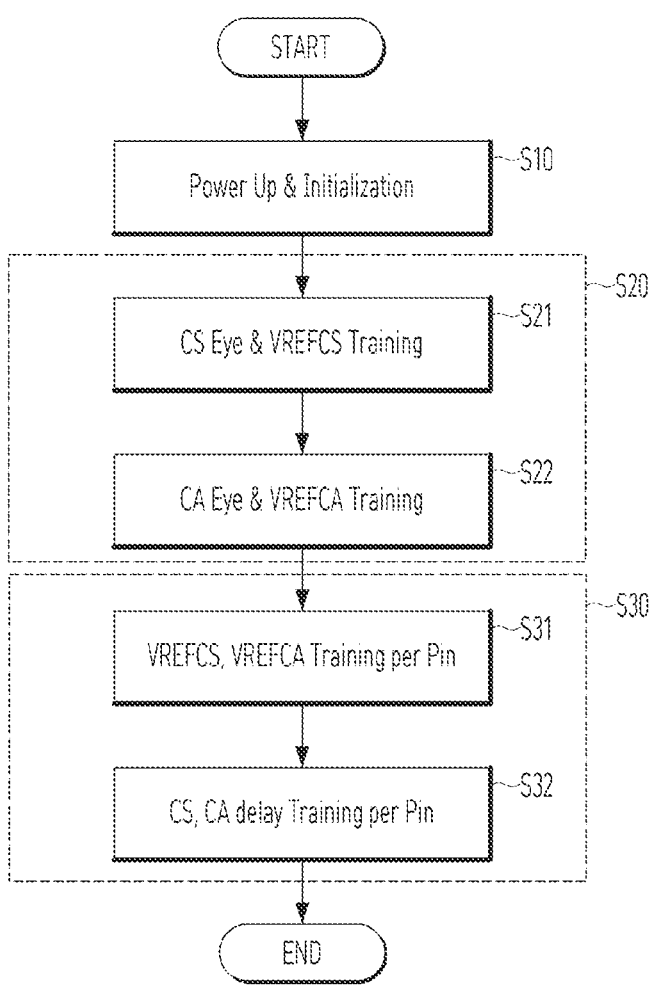
FIG. 7 is a flowchart for describing a training operation of a semiconductor device according to an embodiment of the present disclosure.

FIG. 7 is a flowchart for describing a training operation of a semiconductor device according to an embodiment of the present disclosure.

Referring to FIG. 7, a training operating method of the semiconductor integrated circuit including the plurality of memory devices may include an activation step S10, a coarse training step S20, and a fine training step S30.

The activation step S10 is a step of activating the plurality of memory devices, and may include a power-up operation and an initialization operation. In this case, the power-up operation may include an operation of waiting until the level of a specific node within the memory device becomes a set voltage level or higher after a power supply voltage is applied to the memory device for the first time. The initialization operation may include an operation of forming the outputs or specific nodes of internal specific circuits of the memory device at a set level. That is, the activation step S10 may include an operation of making preparation so that the power supply voltage is applied to the memory device and the memory device may perform a normal operation.

The coarse training step S20 may include a step of performing a training operation by the plurality of memory devices. For example, the coarse training step S20 may include a step S21 of training the reference voltage VREFCS for a chip selection signal determination on the basis of a window CS Eye of the internal chip selection signal CS_i by the plurality of memory devices and a step S22 of training the reference voltage VREFCA for an operation control signal determination on the basis of a window CA Eye of the internal operation control signal CA_i by the plurality of memory devices.

The fine training step S30 may include a step of performing a training operation per pin or per pad, which is included in each of the plurality of memory devices. For example, the fine training step S30 may include a step S31 of training each of the reference voltages VREFCS and VREFCA_B−4 to VREFCA_B+3 for determining signals (e.g., the plurality of external operation control signals CA_e[0] to CA_e[13] or the external chip selection signal CS_e) that are received through the pins or pads, respectively, which are included in one memory device. Furthermore, the fine training step S30 may include a step S32 of training the delay times of signals (e.g., the plurality of external operation control signals CA_e[0] to CA_e[13] or the external chip selection signal CS_e) that are received through the pins or pads, respectively, which are included in one memory device.

More specifically, for example, the coarse training step S20 may include an operation of storing the reference voltage setting signal M_VREFCA[6:0] in the setting circuit 110. The fine training step S30 may include a step S31 of storing, in the setting circuit 110, the reference voltage level selection signals M_CA0_VREF[2:0] to M_CA13_VREF[2:0] that select one of the plurality of reference voltages VREFCA_B−4 to VREFCA_B+3 for an operation control signal determination in response to the reference voltage setting signal M_VREFCA[6:0]. Furthermore, the fine training step S30 may include an operation of storing, in the setting circuit 110, the delay time setting signals M_CS_DLY[3:0] and M_CA0_DLY[3:0] to M_CA13_DLY[3:0] that determine the delay times of signals that are received through the respective pins.

Accordingly, the semiconductor integrated circuit according to an embodiment of the present disclosure can perform a coarse training operation for each memory device, can perform a fine training operation for each pin of each memory device, and can set a reference voltage and a delay time based on the results of each training operation.

Although embodiments according to the technical spirit of the present disclosure have been described above with reference to the accompanying drawings, the embodiments have been provided to merely describe embodiments according to the concept of the present disclosure, and the present disclosure is not limited to the embodiments. A person having ordinary knowledge in the art to which the present disclosure pertains may substitute, modify, and change the embodiments in various ways without departing from the technical spirit of the present disclosure written in the claims. Such substitutions, modifications, and changes may be said to belong to the scope of the present disclosure.

What is claimed is:

1. A training method of a semiconductor device comprising:

performing a coarse training operation for a plurality of memory devices; and performing a fine training operation per pad which is included in each of the plurality of memory devices, wherein the performing of the coarse training operation comprises adjusting a reference voltage level for determining external signals based on windows of the external signals that are received by the plurality of memory devices.

2. The training method of claim 1, wherein the plurality of memory devices receives external signals through a memory buffer.

3. The training method of claim 1, wherein the performing of the fine training operation comprises:

selecting a voltage level of the reference voltage based on the windows of the external signals that are received per pad, and adjusting delay times of the external signals based on the windows of the external signals that are received per pad.

* * * * *